APPARATUS FOR COATING METAL ON A SUBSTRATE

Filed Nov. 8, 1965 3 Sheets-Sheet 1

INVENTORS
I. F. LARSSON
D. PILSETNIEKS

BY
ATTORNEY

Dec. 5, 1967 I. F. LARSSON ET AL 3,356,066

APPARATUS FOR COATING METAL ON A SUBSTRATE

Filed Nov. 8, 1965 3 Sheets-Sheet 2

Dec. 5, 1967 I. F. LARSSON ET AL 3,356,066

APPARATUS FOR COATING METAL ON A SUBSTRATE

Filed Nov. 8, 1965 3 Sheets-Sheet 3

United States Patent Office 3,356,066
Patented Dec. 5, 1967

3,356,066
APPARATUS FOR COATING METAL ON A SUBSTRATE

Ivar F. Larsson, 198 Long Hill Road, Oakland, N.J. 07436, and Dzidris Pilsetnieks, 88 Pemberton Ave., Plainfield, N.J. 07060

Filed Nov. 8, 1965, Ser. No. 506,694
16 Claims. (Cl. 118—109)

ABSTRACT OF THE DISCLOSURE

The disclosure is of solder coating apparatus which includes one or two solder chambers having solder-dispensing openings which have a generally vertical outer face so that an article to be coated is fed vertically across the face of the opening. Solder flow control means comprising an apertured member such as a wire mesh is placed in contact with the solder opening to control the flow of solder onto the article to be coated. The wire mesh includes one portion, the portion first contacted by the article to be coated, which promotes the flow of solder onto the article, and a second portion which is of such a nature that solder will not flow therethrough onto the article. This second portion provides a metering action to remove excess solder from the article.

This invention relates to coating apparatus and, particularly, to apparatus for applying a metallic coating to a body having metallic portions which receive the coating.

The apparatus of the invention is particularly useful for applying a thin coating of tin, a tin-lead solder, or the like to conductive runs on printed circuit boards. It is customary to apply tin solder to the runs on printed circuit boards to protect the runs and to facilitate the subsequent mounting and securing of components thereon. At the present time, the desired tinning operation, as it is called, is performed either by dipping the printed circuit board in a solder bath, or by an electroplating operation, or by applying solder by hand. These are unsatisfactory methods because generally the holes in the printed circuit boards which are adapted to receive component leads become filled with the tin solder, and the tin solder coating is not uniform and of a desired thickness. In addition, a difficult cleaning operation is required to remove solder both from holes and from between conductive lines.

Accordingly, the objects of the invention concern the provision of improved apparatus for applying a uniform and controlled coating of a metal upon metallic portions of a substrate.

Briefly, apparatus embodying the invention includes an apertured member or screen which is coupled to a source of liquid coating material. The screen is of a material, or it is suitably treated, so that it can be wetted by the coating material, and a substrate having metallic portions which are to be coated with the coating material is brought into contact with the screen. The molten coating material, which wets the screen and flows through the screen by capillary action, is deposited on the aforesaid metallic portions of the substrate. The apparatus also includes means for cleaning the substrate, removing excess coating material, and leaving a uniform coating of desired thickness on the metal portions of the substrate.

The invention is described in greater detail by reference to the drawing wherein.

In the following description of the invention, the coating material is assumed to be tin-lead solder which is called tin or solder, and the operation is called soldering or tinning. In addition, the substrate to be coated will be assumed to be a printed circuit board having conductive lines on one or both surfaces, the conductive lines to be coated and the remainder of the substrate to remain clean, including the holes in the board which remain free of solder.

Figure 1:
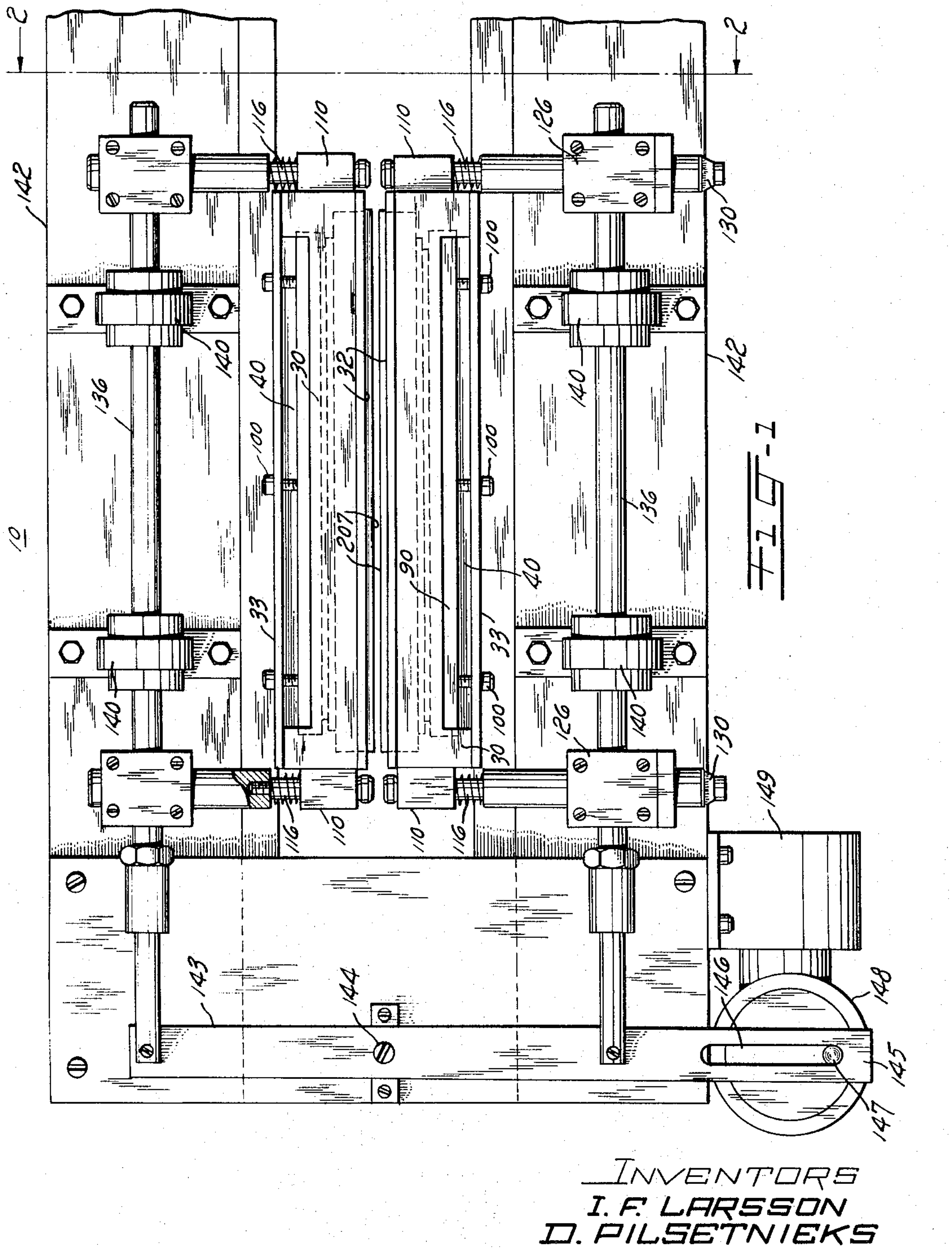
FIG. 1 is a top plan view of apparatus embodying the invention.
Figures 2, 4:
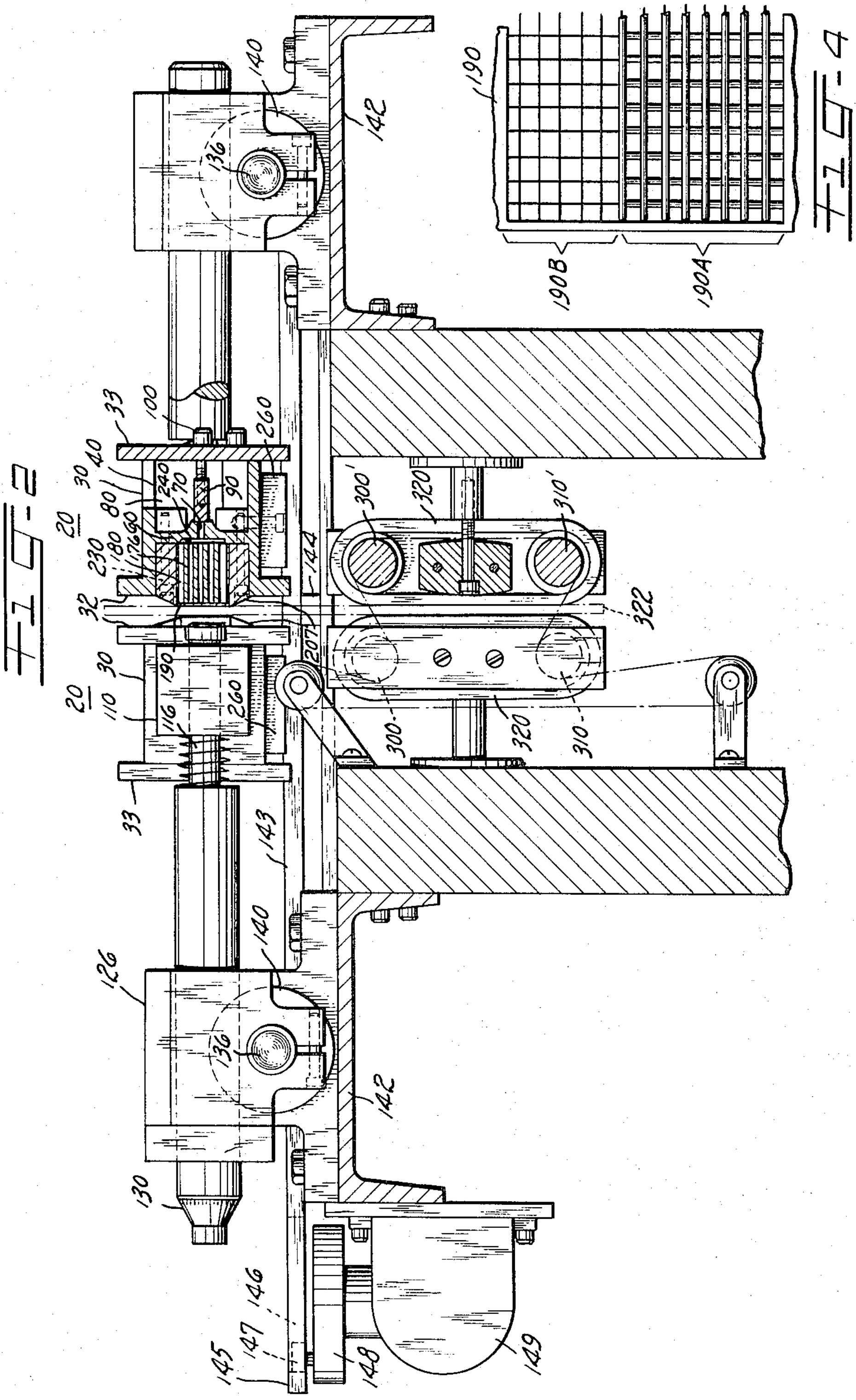
FIG. 2 is an elevational view, partly in section, of the apparatus of FIG. 1 and associated drive apparatus of FIG. 1 and associated drive apparatus.
FIG. 4 is an enlarged and distorted view of a portion of the apparatus of the invention.

Apparatus 10 embodying the invention, referring to FIGS. 1 and 2, includes two containers or solder chambers 20 which are identical. The chambers 20 are generally elongated and have a top wall 30, a bottom wall 31, a front wall 32, and a rear wall 33. The top wall 30 is provided with an elongated slot or opening 40, through which the container 20 is charged with solder. The slot 40 is of a size suitable to receive solder bricks. The front wall 32 is provided with a relatively large, generally rectangular opening 50, which receives a solder transport assembly to be described, and which extends rearwardly as a recess to an intermediate vertical wall 60. The wall 60 extends along the length of the container and has a relatively narrow, horizontal aperture 70 which extends along the length of the wall. The space 80 between the rear wall 33 and intermediate wall 60 comprises a chamber or reservoir for the molten solder to be coated on a printed circuit board.

An adjustable stopper in the form of a thin, elongated, horizontal plate 90 is provided in operative relation with the aperture 70 in the intermediate wall 60. The stopper plate 90 is adapted to block or leave open aperture 70 to either permit or prevent the flow of solder therethrough. A plurality of screw-type adjusting members 100 or the like are secured to the stopper plate 90 and extend through the rear wall 33 of container 20 where they are accessible to permit adjustment of the position of the stopper plate 90 with respect to the aperture 70.

The two containers 20 are oriented side by side (FIGS. 1, 2, and 3) with their front walls 32 facing each other and spaced apart a suitable distance which will be described further below. The containers 20 are provided with means for reciprocating them back and forth longitudinally parallel to each other but in opposition. In one suitable arrangement for performing this function, each container is provided at its ends with an apertured ear 110 in which a horizontal rod 116 is fixed. The ends of the rods 116 remote from the blocks 110 are coupled by a differential thread arrangement or the like to a bracket 126, and the end of each rod 116 extends through the bracket where it is provided with a knob 130. Rotation of rods 116 by means of knobs 130 provides horizontal movement of the rods 116 and the containers 20 toward and away from each other to adjust the spacing between their front walls. Each container 20 thus has two posts 116 and two brackets 126, and both may be movable to adjust the spacing between them, or only one need be adjustable, while the other is fixed.

The reciprocating means includes a longitudinal, horizontal rod 136 which is secured to each pair of brackets 126 and is slidably supported in suitable bearing blocks 140 mounted on a main support base 142. Adjacent ends of the longitudinal rods 136 are secured to any suitable means for imparting reciprocating motion thereto. In one suitable arrangement, the rods 136 are secured to a single horizontal rod 143 which pivots about a point 144 about midway between the points of connection of rods 136 to rod 144, and one end 145 of rod 143 is provided with a rectangular opening 146 which is engaged by a pin 147 on a disk 148 which is rotated by a motor 149 suitably coupled thereto. As disk 148 rotates, the end 145 of rod 143 moves back and forth through a small arc, and rod 143 pivots about point 144. At the same time, rods 136 and containers 20 reciprocate in opposite directions with respect to each other. The rods 136 are adapted to be disconnected from rod 143 so that the containers 20 can be pivoted about rods 136 to empty them for cleaning or the like.

A solder transport assembly 170 is mounted in the recess 50 in the front wall 32 of each container or chamber 20. The solder transport assembly 170 comprises a plurality of thin, elongated sheets 176 of iron or the like which are as long as the opening 50 in the front wall 32 of each container 20. The sheets 176 are perhaps ⅛ inch thick, and they are spaced apart vertically in a stack by suitable shims 180 which themselves may comprise thin, narrow iron plates spaced apart horizontally. The shims may be about $\frac{1}{16}$ inch thick. The shims 180 are positioned between the ends of the sheets 176 so that elongated narrow openings 182 are provided between adjacent sheets through which solder can flow. The openings 182 extend rearwardly and communicate with opening 70 in wall 60. The sheets 176 are of uniform length, width, and thickness, and they are aligned so that the rear edges, front edges, and both ends lie in common planes.

The solder transport apparatus 170 also includes, according to the invention, an apertured screen 190 which encloses the top, front, and bottom of the stack of plates 176. The screen overlies and is in intimate contact with the front edges of plates 176 and is of sufficient area so that it covers the front edges of the plates completely. Thus, the screens of both solder transport assemblies face each other, are generally parallel to each other, and present relatively large-area, generally flat surfaces to each other. The screen is secured to the stack of sheets 176 by means of elongated metal plates 200, 206 which are positioned at the top and bottom of the stack of sheets and which are secured together by means of bolts 210 (FIG. 2) which extend vertically through the stack at the ends thereof. At least the lower plates 206 have facing front surfaces 207 which are slanted at an angle to the vertical so that the opening between them enlarges as one proceeds downwardly from the stack of sheets 176 and screen 190. This enlarged opening between securing plates 206 facilitates the feeding of printed circuit boards to be tinned upwardly into the space between the solder transport assemblies 170.

Each solder transport assembly is secured to the intermediate wall 60 of the chamber, for example, by means of bolts 230 (FIG. 2) which pass generally horizontally through the top and bottom securing plates 200 and 206. To facilitate solder flow, the intermediate wall includes a concave depression 240 which is as wide and long as the stack of sheets 176 and extends along the length of the solder transport assembly.

In order for the apparatus 10 to operate properly, the molten solder, which flows from the reservoir 80 through aperture 70 and between sheets 176, must flow through the screen 190 and onto metallic portions, such as printed circuit lines, on a printed circuit board. In additon, in order for the solder to flow through the apertures in the screen 190, it must wet the screen and flow through the screen by capillary action. Thus, according to the invention, the screen is either made of a material which can be wetted by the solder, or it is treated so that it can be wetted by the solder.

In one arrangement, according to the invention, the screen is made of steel wire, and it is treated to provide two portions, each having different metallurgical characteristics. A first lower portion 190A, which is the first to be contacted by the printed circuit board to be tinned, extends from the bottom of the screen at plate 206 to perhaps about the center thereof and is treated so that it can be wetted by the solder and so that the solder can flow by capillary action through the apertures in the screen to the board to be coated. According to the invention, this treatment comprises coating the portion 190A of the screen with a high temperature tin-lead solder which has a melting point of the order of 100° higher than the temperature of the molten solder used in the coating operation. The second portion 190B of the screen, which extends from the treated portion upwardly and comprises the remainder of the screen, has the characteristic that it cannot be wetted by the solder, and the solder cannot flow through its apertures. Thus, this portion of the screen is not treated and is used to perform a cleaning operation. As noted above, the screen may be made of steel, or the like, and its openings are suitably large to permit solder to pass by capillary action through treated portion 190A, but not portion 190B. Screen of about 200 to 400 mesh can be used, as an example. The screen and its treated and untreated portions are shown exaggerated in FIG. 4. Normally, the tin coating on portion 190A need only be thick enough to coat the wires of the screen and provide the desired wetting action.

The apparatus 10 is provided with suitable heating means for maintaining the solder in reservoirs 80 in a fluid state and for maintaining all parts, including the feed plates 176 and the screen 190, at operating temperature. The heating means may be a strip electric heater 260 mounted between the front and rear walls of the chamber and in contact with lower wall 31 which is the base of the solder reservoir 80.

Figures 3, 5:
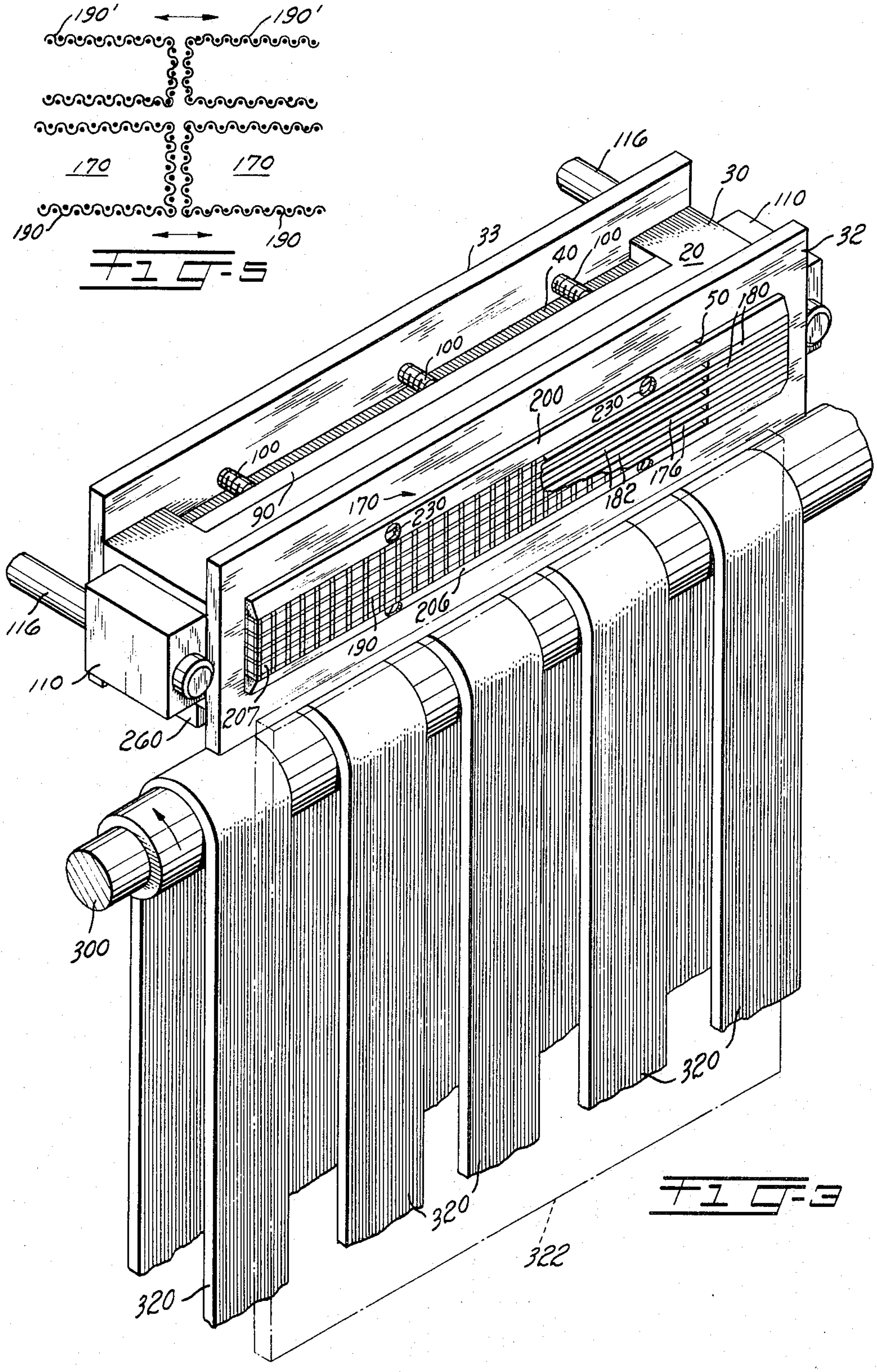
FIG. 3 is a perspective view of a portion of the apparatus of the invention.
FIG. 5 is a schematic representation of a portion of a modification of the invention.

In one suitable arrangement for feeding boards to be coated between the solder screens 190, two pairs of vertically spaced-apart shafts 300, 310, and 300′, 310′ are positioned beneath the solder chambers 20 parallel to, but spaced from, each other. The shafts are suitably coupled together by means of gears, chains, or the like, and to a suitable drive means, not shown, so that shafts 300, 310 rotate counter-clockwise and shafts 300′, 310′ clockwise, as seen in FIGS. 2 and 3. A plurality of separate belts 320 of fabric, rubber, or the like are mounted on the drive shafts. The belts are of a material suitable to provide a gripping action on boards to be passed between the soldering chambers. In operation of this apparatus, the shafts 300, 310, 300′, 310′ are rotated so that the facing surfaces of the belts 320 move upwardly, and printed circuit boards 322 inserted between the belts from below are drawn upwardly by the belts and fed upwardly between the soldering chambers.

In operation of the invention, motor 148 is turned on and the containers 20 reciprocate with respect to each other. A printed circuit board 322 is inserted upwardly between plates 206, and it passes first between the treated or tinned portions 190A of the screens at the lower ends thereof, and it is drawn or pushed upwardly between the screens. It is to be noted that the containers 20 are so spaced apart that both screens 190 are in contact with the printed circuit board as it passes between them. As the board proceeds along the treated portion of the screens, the molten solder wets and flows by capillary action through screen portion 190A and adheres to the metallic lines on the board. As the board continues on its path of travel and passes between the untreated portions 190B of the screens, these portions of the screens remove excess tin and leave a thin, uniform coating of tin on the conductive lines. Excess coating material is also removed from between the conductive lines and from the apertures in the board. It has been found that the opposed reciprocating motion of the screens optimizes the overall operation of the apparatus including the wetting, coating, and cleaning operations. It has also been found that the apparatus 10 does not permit solder to fill any holes present in a printed circuit board as it is tinned.

If desired, the apparatus 10 may be modified by tinning all of screen 190 in each solder transport apparatus 170 and providing a separate untinned screen 190' on a suitable support placed directly above screen 190 and positioned to provide the function of portion 190B of screen 190 described above. Such an arrangement is shown schematically in FIG. 5.

The apparatus of the invention provides a favorably thin, uniform coating of solder on the runs or conductive portions of printed circuit boards at favorable speed. The apparatus also provides a printed circuit board in which the non-metal portions of the board and holes in the board are free of solder.

Of course, it is clear that many modifications may be made in the specific apparatus described while practicing the principles of the invention.

What is claimed is:

1. Apparatus for coating metal on a substrate comprising a reservoir of liquid coating material, said reservoir having a feed opening through which said coating material is discharged, a metal mesh screen covering said opening in said reservoir in contact with said liquid coating material and adapted to have a substrate brushed across it to effect the coating operation, said mesh screen having a first portion adapted to transmit said liquid coating material onto said substrate as said substrate passes in contact with it, said mesh screen having a second portion which cannot transmit coating material to said substrate as the substrate passes in contact with it but serves to remove excess coating material from said substrate.

2. Apparatus for coating metal on a substrate comprising a chamber which has a reservoir of liquid coating material, said chamber having an opening through which said coating material is adapted to be fed to a substrate, and a metal mesh screen mounted on said chamber covering said opening and in contact with said reservoir of liquid coating material, said mesh screen being positioned so that a substrate to be coated can be moved across said screen in contact therewith, said screen having a first portion adapted to transmit said liquid coating material through its apertures onto said substrate, said screen having a second portion which cannot transmit coating material to said substrate and serves to remove excess coating material from said substrate as said substrate moves across it.

3. Metal coating apparatus comprising a reservoir of molten metal to be coated on a substrate, an aperture in said reservoir through which molten metal flows to said substrate, and a metal mesh screen covering said aperture for feeding molten metal from said reservoir to said substrate which is adapted to be moved across said screen and in contact therewith, said mesh screen including a first portion which is adapted to pass molten metal and permits it to be applied to the substrate and a second portion which is adapted not to pass molten metal to said substrate and removes excess metal from said substrate as the substrate passes by said means in contact therewith.

4. The apparatus defined in claim 3 wherein at least said first portion of said screen has a surface which can be wetted by said molten metal so that said molten metal can flow through said screen onto said substrate.

5. The apparatus defined in claim 3 wherein at least said first portion of said screen has a coating of a material which can be wetted by said molten metal but which will not melt at the temperature of said molten metal.

6. The apparatus defined in claim 3 wherein at least said first portion of said screen has a coating of a material which can be wetted by said molten metal but which will not melt at the temperature of said molten metal, said second portion of said screen being of a material which cannot be wetted by said molten metal.

7. The apparatus defined in claim 3 wherein said molten metal is a relatively low temperature solder and said first portion of said screen is coated with a material which can be wetted by said solder but has a melting point which is higher than that of said solder.

8. The apparatus defined in claim 3 and including means coupled to said reservoir for moving the same with respect to a substrate moving past said screen during a coating operation.

9. Metal coating apparatus comprising two containers each including a reservoir of molten metal to be coated on a substrate, said containers being oriented facing each other and spaced apart to permit said substrate to pass between them, each container also including a metal feed aperture through which molten metal flows to said substrate, the metal feed apertures in said containers being positioned so that they face each other and an apertured screen member covering each of said metal feed apertures for controlling the flow of solder onto said substrate, said substrate being adapted to move past said apertured screen members in contact therewith, said apertured screen members including a first portion, first contacted by said substrate as said substrate passes between said containers, which is adapted to pass molten metal and permits it to be applied to the substrate and a second portion, last contacted by said substrate, which is adapted not to pass molten metal and removes excess metal from said substrate as the substrate passes across it.

10. Soldering apparatus comprising two containers oriented horizontally and aligned with and facing each other and spaced apart a distance suitable to permit a substrate to be coated to pass between them, each container including a reservoir for molten metal to be coated on a substrate, and an aperture in a wall of each container through which metal is fed into said reservoir to fill said reservoir, each container including a solder transport recess in communication with the reservoir in the container and a solder transport assembly mounted in said recess, said solder transport assemblies facing each other in operative relation with each other, said solder transport assembly comprising a plurality of spaced-apart relatively thin sheets of metal of substantially the same size and shape and arranged in a stack having a length substantially equal to the length of said solder transport recess in each container, said sheets having aligned front edges, and a mesh screen enclosing and surrounding said stack of metal sheets and in contact with the front edges of said sheets, said screen being of substantially the same length as said sheets, said screen including one portion which is adapted to be wetted by said molten metal and which can transmit said metal to a substrate and another portion which is adapted not to be wetted by said metal and cannot transmit metal to said substrate.

11. The apparatus defined in claim 10 and including drive means for reciprocating said containers back and forth as a substrate passes between them.

12. The apparatus defined in claim 10 and including means for adjusting the spacing between said containers.

13. Soldering apparatus comprising two containers oriented horizontally and aligned with and facing each other and spaced apart a distance suitable to pass a substrate between them, each container including a reservoir for molten metal to be coated on a substrate, and an aperture in a wall of each container through which metal is fed into said reservoir to fill said reservoir, each container including a solder transport recess in communication with the reservoir in the container and a solder transport assembly mounted in said recess, said solder transport assemblies facing each other in operative relation with each other, said solder transport assembly comprising a plurality of relatively thin sheets of metal of substantially the same size and shape and arranged in a stack having a length substantially equal to the length of said solder transport recess in each chamber, said sheets having aligned front edges, adjacent sheets being spaced apart by metal spacer plates positioned between the ends of the sheets at their opposite ends, a mesh screen enclosing and surrounding said stack of metal sheets in contact with the front edges of said sheets, said screen being of substantially the same length as said sheets, said screen including one portion which is contacted first by said substrate and is adapted to be wetted by said molten metal and which can transmit said metal to a substrate and another portion which is contacted by said substrate after it has been coated and is adapted not to be wetted by said metal and cannot transmit metal to said substrate, top and bottom plates securing said screen and said sheets together as a unitary assembly, and means securing said solder transport assembly in said solder transport recess in each container.

14. The apparatus defined in claim 13 wherein said screen which is in contact with the front edges of said sheets presents a generally rectangular working surface to said substrate, said rectangular surface being oriented vertically and said substrate being adapted to pass vertically upwardly past the screen surface and in contact therewith, the lower portion of the rectangular screen surface being adapted to be wetted by the molten metal and the upper portion being adapted not to be wetted by the molten metal.

15. The apparatus defined in claim 13 and including means for adjusting the spacing between said containers and for reciprocating said containers with respect to a substrate, said means including a rod secured to the opposed ends of each container and extending horizontally therefrom, the two rods associated with each container being threadedly secured to a bracket whereby rotation of said rods serves to adjust the spacing between said container, an auxiliary rod secured between the pair of brackets associated with each container, and drive means coupled to each auxiliary rod for reciprocating the rod and the container coupled thereto.

16. The apparatus defined in claim 9 and including a plurality of plates in each aperture in each container, said plates providing communication and a flow path for said molten metal between said reservoir of metal and said apertured member.

References Cited

UNITED STATES PATENTS

| | | | |
|---|---|---|---|
| 346,869 | 8/1886 | Sherck et al. | 118—411 |
| 875,546 | 12/1907 | Metzner | 118—401 X |
| 973,649 | 10/1910 | Goldsmith. | |
| 3,157,536 | 11/1964 | Caines | 118—411 X |

CHARLES A. WILLMUTH, *Primary Examiner.*

J. P. McINTOSH, *Assistant Examiner.*